United States Patent [19]

Landingham et al.

[11] 4,336,304
[45] Jun. 22, 1982

[54] CHEMICAL VAPOR DEPOSITION OF SIALON

[75] Inventors: Richard L. Landingham; Alton W. Casey, both of Livermore, Calif.

[73] Assignee: The United States of America as represented by the United States Department of Energy, Washington, D.C.

[21] Appl. No.: 40,810

[22] Filed: May 21, 1979

[51] Int. Cl.$^3$ .................. B32B 9/04; B32B 9/00; B05D 5/12

[52] U.S. Cl. ................. 428/336; 428/408; 428/446; 428/447; 428/454; 428/698; 427/34; 427/94; 427/126.1; 427/126.4; 219/553; 427/126.6; 501/98; 501/99

[58] Field of Search ............ 427/34, 94; 428/336, 428/538, 446, 447, 454, 408

[56] References Cited

U.S. PATENT DOCUMENTS

| | | | |
|---|---|---|---|
| B 581,564 | 5/1976 | Jacobson | 427/94 X |
| 3,794,003 | 10/1976 | Zirinsky et al. | 427/94 X |
| 3,895,219 | 7/1975 | Richerson et al. | 428/446 X |
| 4,036,653 | 7/1977 | Jacobson | 427/94 X |
| 4,118,539 | 10/1978 | Hirai et al. | 427/94 X |

OTHER PUBLICATIONS

Niihara et al., *Chemical Vapour–Deposited Silicon Nitride, Part 1, Preparation and Some Properties,* In J. of Materials Science, 11 (1976), pp. 593–603.

Niihara et al., *Chemical Vapour–Deposited Silicon Nitride, Part 2, Density and Formation Mechanism,* J. of Material Science, 11 (1976), 604–611.

Poponiak et al., *Formation of Thick $Si_3N_4$ or $Si_xO_yN_z$ on Si Substrate by Anodnitridization,* In IBM Technical Disclosure Bulletin, vol. 19, No. 3, p. 905, Aug. (1976).

Brown et al., *Properties of $Si_xO_yZ_z$ Films on Si,* In J. Electrochem. Soc.: Solid State Science, Mar. (1963), pp. 311–317.

Jack, *Review Sialons and Related Nitrogen Ceramics,* In J. of Materials Science, 11 (1976), pp. 1135–1158.

*Primary Examiner*—P. Ives
*Attorney, Agent, or Firm*—William S. Bernheim; Roger S. Gaither; James E. Denny

[57] ABSTRACT

A laminated composite and a method for forming the composite by chemical vapor deposition. The composite includes a layer of sialon and a material to which the layer is bonded. The method includes the steps of exposing a surface of the material to an ammonia containing atmosphere; heating the surface to at least about 1200° C.; and impinging a gas containing in a flowing atmosphere of air $N_2$, $SiCl_4$, and $AlCl_3$ on the surface.

11 Claims, 1 Drawing Figure

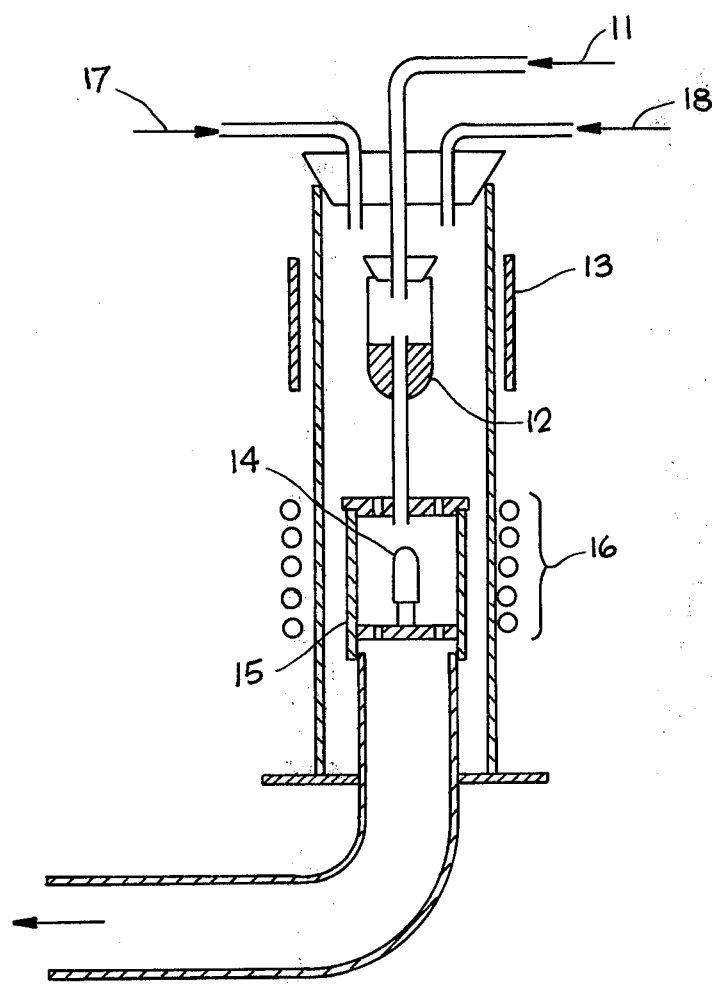
Fig.

CHEMICAL VAPOR DEPOSITION OF SIALON

BACKGROUND OF THE INVENTION

1. Field of the Invention

The invention described herein relates to a laminated composite of a sialon layer bonded to a surface of a material, more particularly, this material is a refractory material such as silicon nitride or graphite. In addition the invention relates to a method for forming the composite by chemical vapor disposition of the sialon. In particular, sialons are compositions which include all of the following: silicon, aluminum, oxygen, and nitrogen and are illustrated by $Si_3Al_3O_3N_5$.

2. Description of the Prior Art

Efforts have been made to construct a helical expander to recover heat energy by directly expanding combustion gases in coal-burning power plants. It is expected, that if a suitable expander were available, the typical generating efficiency of these plants could be increased from 34–40% to 50–60%.

These efforts have not succeeded because the materials considered for constructing the expander could not survive the environment for a practical length of time. Fouling as a result of silica carried in the combustion gases is a major problem. Efforts at removing the silica prior to the gases entering the expander have not ameliorated the problem. The gases from the combustion are typically at temperatures between 1000° C. and 1400° C. and at a pressure on the order of 240 MPa (megapascals). Further, the gases include corrosives, such as, hydrogen sulfide and sulfuric acid.

Helical expanders having a ceramic rotor have been considered. The ceramic would provide protection against temperature and corrosives. Silicon nitride ($Si_3N_4$), a ceramic which has been employed in stator blades of high-temperature gas turbines, has been suggested as the ceramic from which to fabricate parts for the helical expander.

Unfortunately, the compatibility of silicon nitride is not favorable to long term exposure to a combustion-gas environment. Rapid fouling and oxidation occurs and appears to be the result of the porosity and composition of the surface of parts fabricated with silicon nitride.

STATEMENT OF THE OBJECTS

Accordingly, an object of this invention is a composite including a coating suitable to be in contact with the combustion gases of a coal-burning power plant and from which parts of a helical expander can be fabricated.

Another object is a method of applying a coating, which is resistant to silica fouling, to a silicon-nitride surface or other surfaces.

Yet another object is a method of applying a refractory coating which is suitable for use as a coating for a rotor for a helical expander which is to be employed to recover energy directly from the combustion gases of a coal-burning power plant.

Other objects, advantages and novel features of the invention will become apparent to those skilled in the art upon examination of the following description of the invention and the accompanying drawing.

SUMMARY OF THE INVENTION

A novel method for forming a novel laminated composite, which includes a refractory material and a sialon layer bonded to the refractory material, is described. The preferred refractory material is silicon nitride. The preferred sialon composition for an oxidative environment such as the combustion gases from a coal-burning power plant is $Si_3Al_3O_3N_5$.

The steps of the method include exposing a surface of the refractory material to an ammonia-containing atmosphere; heating the surface to at least about 1200° C.; and impinging the surface with a gas which includes $N_2$, $SiCl_4$, and $AlCl_3$. In the preferred impinging gas, $SiCl_4$ has a concentration of between about 100 and about 1000 ppm and $AlCl_3$ has a concentration of between about 100 and about 1000 ppm.

In a preferred embodiment, a sialon layer is applied to seal the porosity of a helical-expander rotor fabricated from silicon nitride.

BRIEF DESCRIPTION OF THE DRAWING

The FIGURE is a schematic of an apparatus for depositing a sialon coating onto a graphite substrate according to the method of this invention.

DETAILED DESCRIPTION

The present invention includes a method for chemical vapor deposition of a sialon as a coating on a surface of a refractory material, such as graphite or silicon nitride. Ceramics or refractory metals are preferred as the refractory material. The coating provides a hard (a Knoup microhardness of from about 1000–1500) and a dense (at least 95% of theoretical) sialon surface to the rotor resistant to erosion, fouling, and oxidation when exposed to a high-temperature gas stream.

A coating having a thickness of about 0.025 mm is sufficient to provide protection to the surface on which it is deposited. Of course, if the coating is subject to unusual erosion such as when a fluid stream impinges directly thereon, a thicker coating should be formed.

Sialons are ceramics which include all of the following: silicon, aluminum, oxygen, and nitrogen in varying amounts and which have a typical density of about 3.2 g/cc. The relative amounts of the elements can be varied to obtain sialons with different properties. For example, different sialons will be preferred for a reductive environment than the one preferred here for the oxidative environment discussed. One current view is that the sialons are similar to the silicate family of compounds and that the oxygen can be partially replaced by nitrogen. In general, sialons are hard refractory ceramics resistant to high-temperature oxidation and to silica fouling. It is also possible to substitute other metals (Y, Ca, Ce, Zr, Mg, and Be) for aluminum in sialons to vary the material properties.

In the method, the ammonia-containing atmosphere will preferably also contain $H_2$ and such $H_2$ will be in a molar concentration greater than the ammonia. The temperature of the impinging gas will preferably be greater than 200° C. to assure that the $AlCl_3$ will be carried in a vaporized state. The impinging gas will also be predominantly mono and diatomic nitrogen. The maximum temperature to which the surface of the refractory material is heated will generally be set below the melting point or decomposition temperature of the refractory material, for example, for silicon nitride the maximum temperature is about 1400° C.

EXAMPLE

The FIGURE is a schematic drawing of a furnace apparatus in which a sialon was coated by chemical vapor deposition onto a graphite substrate. The overall chemical reaction is as follows:

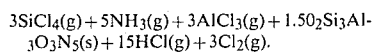

$3SiCl_4(g) + 5NH_3(g) + 3AlCl_3(g) + 1.5O_2 \rightarrow Si_3Al_3O_3N_5(s) + 15HCl(g) + 3Cl_2(g).$ $SiCl_4$ in a $N_2$ carrier stream 11 is mixed with $AlCl_3$ gas (vaporized from solid $AlCl_3$ in vessel 12 by heating the vessel with clamshell heater 13) and impinges on a graphite substrate 14 located within a furnace 15 which is heated with an induction heater 16. A flowing atmosphere of air (stream 17) and $NH_3+N_2+H_2$ (these three introduced as stream 18) is maintained within the furnace.

In a representative run, conditions were as follows: flow of dry $N_2 = 375$ STPcc/min; flow of $N_2$ with $SiCl_4$ added by use of a bubbler $= 185$ STPcc/min; flow of $H_2 = 800$ STPcc/min; flow of air $= 16$ STPcc/min; flow of $NH_3 = 500$ STPcc/min; chamber pressure $= 150$ torr; temperature in $AlCl_3$ vaporization vessel 12 $= 200°$ C.; furnace temperature $= 1288°$ C.; run time $= 55$ min. A coating of 0.025 mm average thickness was deposited on the graphite substrate (the coating thicknes was difficult to measure, and varied from 0.0012 mm to 0.005 mm). There appeared to be no coating on the hemispherical (upstream) end of the substrate, and a gradual thickening in the downstream direction; this was thought to be due to a thermal gradient on the substrate caused by the cooling effect of the inlet gases. X-ray diffraction and fluoresence analyses of the coating showed the existence of various crystalline or amorphous sialon coatings.

The foregoing description of the invention has been presented for purposes of illustration and description and is not intended to be exhaustive or to limit the invention to the precise form disclosed. It was chosen and described in order to best explain the principles of the invention and their practical application to thereby enable others skilled in the art to best utilize the invention in various embodiments and with various modifications as are suited to the particular use contemplated. It is intended that the scope of the invention be defined by the claims.

What is claimed is:

1. A composite comprising a refractory material coated with a layer of sialon formed by chemical vapor deposition in a flowing atmosphere of air.

2. The composite according to claim 1 wherein said material is silicon ntiride.

3. The composite according to claim 1 wherein the majority of said sialon is $Si_3Al_3O_3N_5$.

4. The composite according to claim 1 wherein the layer of sialon has an average thickness of about 0.025 mm.

5. The composite according to claim 1, wherein said refractory material is graphite.

6. A method for coating a surface of a material with a sialon composition in a flowing atmosphere of air to provide a hard, dense, refractory surface, the method comprising:
   a. exposing a surface of a refractory material to an ammonia-containing atmosphere;
   b. heating the surface to at least about 1200° C.;
   c. impinging a gas comprising $N_2$, $SiCl_4$, and $AlCl_3$ on the surface.

7. The method according to claim 6 wherein the coating formed has an average thickness of about 0.025 mm.

8. The method according to claim 6 wherein the atmosphere to which the surface is exposed comprises air, $NH_3$, $N_2$ and $H_2$.

9. The method according to claim 6 wherein the surface is a silicon-nitride surface.

10. The method according to claim 6 wherein the surface is a graphite surface.

11. The method according to claim 6 wherein the concentration in the impinging gas of $SiCl_4$ is between about 100 and 1000 ppm and of $AlCl_3$ is between about 100 and 1000 ppm.

* * * * *